United States Patent [19]
Ishitani

[11] 3,982,264
[45] Sept. 21, 1976

[54] JUNCTION GATED FIELD EFFECT TRANSISTOR

[75] Inventor: Akiyasu Ishitani, Atsugi, Japan

[73] Assignee: Sony Corporation, Tokyo, Japan

[22] Filed: Jan. 27, 1975

[21] Appl. No.: 544,508

Related U.S. Application Data

[63] Continuation of Ser. No. 384,234, July 31, 1973, Pat. No. 3,852,864.

[30] Foreign Application Priority Data

Apr. 25, 1973  Japan.............................. 48-47445

[52] U.S. Cl.............................. 357/22; 357/20; 357/36; 357/55
[51] Int. Cl.².......................................... H01L 29/80
[58] Field of Search .................. 357/20, 22, 49, 36, 357/55

[56] References Cited
UNITED STATES PATENTS
3,767,982  10/1973  Teszner et al. ...................... 357/22

FOREIGN PATENTS OR APPLICATIONS
46-41654  12/1971  Japan................................... 357/22
1,026,524  4/1966  United Kingdom.................... 357/22

OTHER PUBLICATIONS
A. Morgan et al., "A Proposed Vert. Chan. Var. Res. Fet," Proc. IEEE, vol. 59, No. 5, May 1971, pp. 805–807.

Primary Examiner—Michael J. Lynch
Assistant Examiner—Joseph E. Clawson, Jr.
Attorney, Agent, or Firm—Hill, Gross, Simpson, Van Santen, Steadman, Chiara & Simpson

[57]  ABSTRACT

A junction gated field effect transistor having a substrate providing a drain region of low impurity concentration, a mosaic shaped gate region of high impurity concentration formed on the drain region, a corresponding mosaic shaped insulating layer overlying said mosaic shaped gate region but having windows therein smaller than the windows of the gate region, the windows of the insulating layer being aligned with the windows of the gate region, a gate electrode connected to said mosaic shaped gate region, a plurality of source regions of high impurity concentration formed on the substrate in the openings of the mesh forming the insulating layer, and a conductive plate source electrode overlying said insulating layer and in contact with said source regions.

11 Claims, 16 Drawing Figures

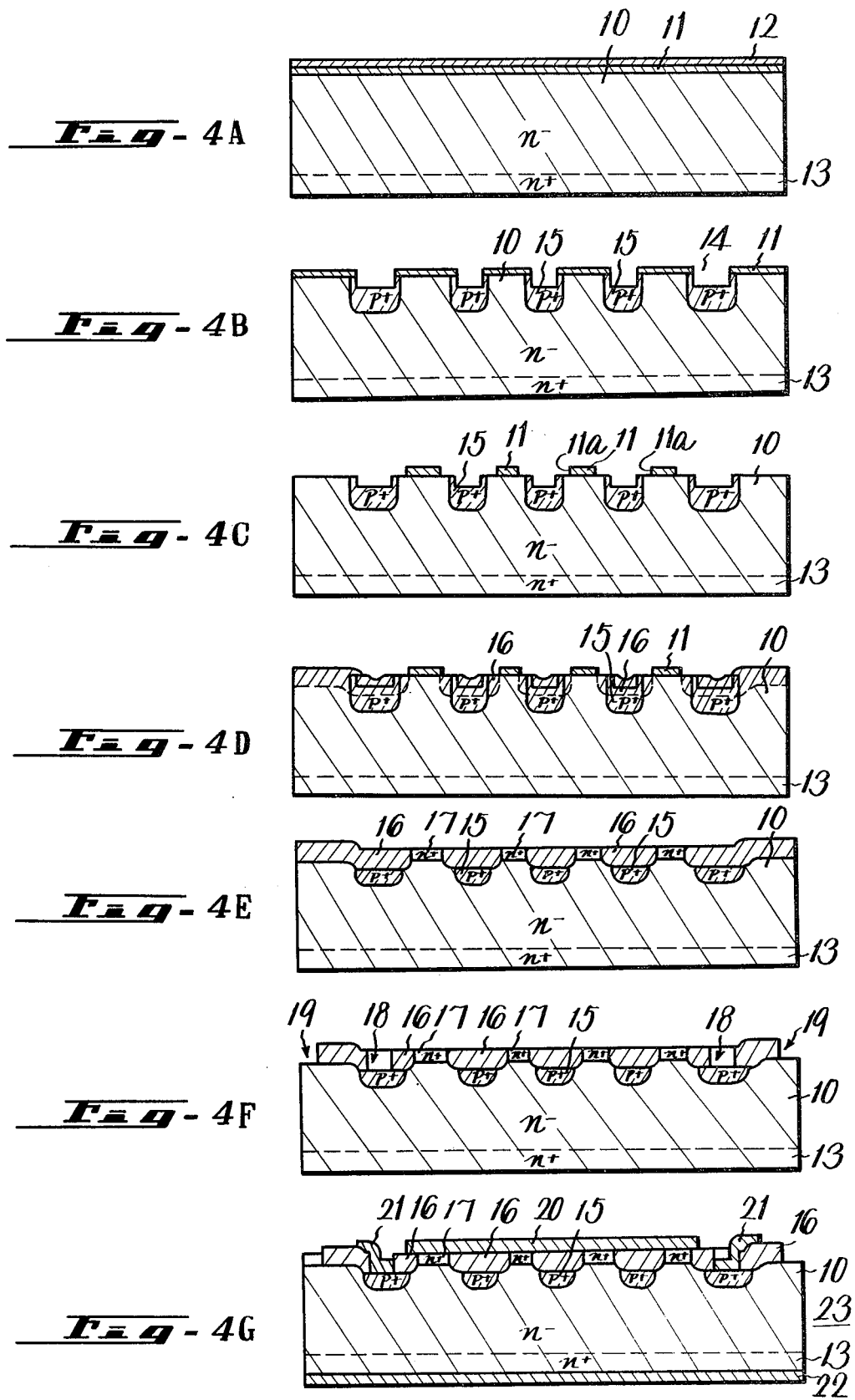

JUNCTION GATED FIELD EFFECT TRANSISTOR

This is a continuation of application Ser. No. 384,234, filed July 31, 1973, now U.S. Pat. No. 3,852,864.

BACKGROUND OF THE INVENTION

1. Field of the Invention

This invention relates generally to a junction gated field effect transistor (sometimes referred to as a junction field effect transistor), and more particularly to a junction gated field effect transistor in which a current flowing longitudinally therethrough is controlled laterally.

2. Description of the Prior Art Recently, a field effect power transistor with a triode characteristic has been proposed as a junction gated field effect transistor. See "Denshi Zairyo" (Electric Parts and Materials), October 1971, pages 22 to 27. Such an arrangement is shown as an example of the prior art in FIG. 1 of the drawings hereof. In this prior art structure, a field effect transistor for electric power comprises a P-type semiconductor layer 2 of high impurity concentration, and provides a gate region of a mesh type (in plan view) formed by diffusion into an N-type silicon body 1 of low impurity concentration or even of intrinsic material. This semiconductor body 1 becomes the drain region, while a source region 3 is formed by epitaxial growth on the drain region to surround the P-type semiconductor layer 2. Electrodes 4, 5 and 6 are provided as connections to the drain region 1, the gate region 2 and the source region 3, respectively. This type of field effect transistor has a triode characteristic instead of a saturation characteristic due to the fact that a series resistance from the source to the channel surrounded by the gate is reduced a great deal and a characteristic is obtained wherein the conversion conductance is great at low output impedance due to a gate of mesh type and it is operable at high electric power. With such a prior art junction type field effect transistor, the source region 3 must be formed by epitaxial growth at low temperature and, due to the fact that the gate region 2 of high impurity concentration is adjacent to the source region of high impurity concentration, it is difficult to establish a sufficiently high withstanding voltage therebetween. Furthermore, it is difficult to form the source region 3 with a sufficiently high impurity concentration.

In order to avoid such drawbacks encountered in the transistor shown in FIG. 1, a transistor, as shown in FIG. 2, has been suggested in which a source region 3 is formed to have an N-type region 7 of low impurity concentration in the vicinity of a gate region 2 and an N-type region 8 of high impurity concentration is formed on the region 7 to thereby improve the withstanding voltage. However, with such a transistor, a new drawback may be introduced, namely, the series resistance from the source to the gate or the source resistance increases.

Further, with the transistor shown in FIG. 1, it is rather difficult to form the gate electrode 5, and the gate region 2 and the drain region 1 inevitably become to a mesa type.

SUMMARY OF THE INVENTION

It is an object of the present invention to provide a vertical type junction gated field effect transistor free from the drawback above mentioned which has been encountered in the prior art.

It is another object of the present invention to provide a junction gated field effect transistor for handling large electric power and which has high conversion conductance.

It is a further object of the invention to provide a junction gated field effect transistor which has a high withstanding voltage between its source and gate and a small input capacity.

It is a still further object of the invention to provide a junction gated field effect transistor in which the position of a varied gate region and a source region of high impurity concentration is accurately determined and is high in reliability.

It is still another and further object of the present invention to provide a junction gated field effect transistor having a substrate providing a drain region of low impurity concentration, a mosaic shaped gate region of high impurity concentration formed on the drain region, a corresponding mosaic shaped insulating layer overlying said mosaic shaped gate region but having windows therein smaller than the windows of the gate region, the windows of the insulating layer being aligned with the windows of the gate region, a gate electrode connected to said mosaic shaped gate region, a plurality of source regions of high impurity concentration formed on the substrate in the openings of the mesh forming the insulating layer, and a conductive plate source electrode overlying said insulating layer and in contact with said source regions.

The additional and other objects, features and advantages of the invention will become apparent from the following description taken in conjunction with the accompanying drawings.

BRIEF DESCRIPTION OF THE DRAWINGS

FIGS. 4A to 4G, inclusive, are cross-sectional views showing a process for making the junction gated effect transistor shown in FIG. 3;

DESCRIPTION OF THE PREFERRED EMBODIMENTS

Figure 1:
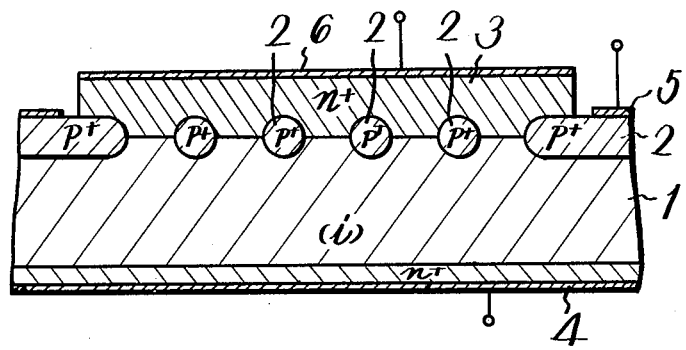
FIG. 1 is a cross-sectional view showing a vertical junction field effect transistor of the prior art.
Figure 2:
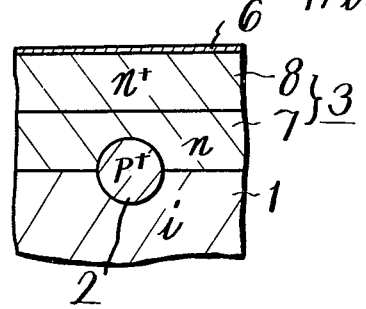
FIG. 2 is a cross-sectional view showing another type of a prior art vertical junction field effect transistor.

An embodiment of a vertical junction gated field effect transistor, which will be hereinbelow referred to as an FET only, according to the invention will be described together with its manufacturing process with reference to FIGS. 3, 4A to 4G and 6.

According to the present invention, an N-type silicon semiconductor body 10 of low impurity concentration, which may become a drain region, is prepared, by way of example, as shown in FIG. 4A. A silicon nitride ($Si_3N_4$) layer 11 is coated on one of the surfaces of the silicon semiconductor body 10 and then a silicon dioxide (SiO₂) layer 12 is coated on the silicon nitride layer 11. In this case, if necessary, an N-type semiconductor layer 13 of high impurity concentration may be formed on the opposite surface of the body 10 by diffusion or epitaxial growth, which serves for forming a drain electrode.

Next, the silicon dioxide layer 12 is subjected to a photoetching process to form a mosaic (mesh) pattern therein and then the silicon nitride layer 11 is also subjected to an etching process to form a similar mosaic (mesh) pattern by utilizing the mosaic pattern of the silicon dioxide layer 12 as a mask which is then removed. Thereafter, an etchant is applied to the exposed surface of the body 10, with the mosaic pattern of the layer 11 as a mask, to form recess portions 14 on the surface of the body 10 which recess portions 14 are similarly located in a mosaic pattern. Into the recess portions 14 of the body 10, a P-type impurity is diffused with the silicon nitride layer 11 of mosaic pattern as a mask to form a P-type gate region 15 of high impurity concentration having a mosaic pattern, as shown in FIG. 4B.

The outer peripheral portion of the remaining silicon nitride layer 11, except for the portion that is used for leading out a gate electrode and an operating portion as an FET, is removed, and also the silicon nitride layer portions, which form the mosaic pattern, are removed partially to widen the size of the aperture 11a (FIG. 4C) of the mosaic pattern, so that the N-type body 10, which is adjacent to the P-type region 15, is exposed.

Widening of the aperture 11a of the silicon nitride layer 11 can be easily achieved by forming the layer 11 thick enough at first and applying an etching process to the layer 11 over its entire surface after diffusing the P-type impurity to the body 10.

Then, the exposed surface of the semiconductor body 10 is heated in the order of 900° to 1100°C to cause thermal oxidation of the exposed surface thereof. The surface of the semiconductor body 10 under the silicon nitride layer 11 is not oxidized, but the surface of the body 10 not covered with the layer 11 is ozidized by this heating. Thus, a silicon dioxide layer 16 is formed on the exposed surface of the body 10 to cover or bury the gate region 15, as shown in FIG. 4D. In this case, it is preferred that the thickness of the silicon dioxide layer 16 be selected to be about 1 to 2 microns.

Under an alternate procedure, as shown in FIGS. 5A to 5D, when the silicon dioxide layer 16 is formed, a silicon dioxide layer 24 may be previously formed under the silicon nitride layer 11, and recess portions 14 are formed on the surface of the body 10, the P-type impurity is diffused thereinto to form the gate region 15, and thereafter the silicon dioxide layer 24 is subjected to an over etching process with the silicon nitride layer 11 as a mask to widen the apertures 24a of the silicon dioxide layer 24. Under such a condition, it is subject to a thermal oxidation step to form the oxidized layer 16.

Referring back again to the form shown in FIG 4D, the silicon nitride layer 11 is then removed to expose the surface of the N-type silicon body of a trapezoid or mesa type having a mosaic pattern which is surrounded by the silicon dioxide layer 16. Then, an N-type impurity of high concentration is diffused into the trapezoid portion of the silicon body from the exposed surface to form a source region 17 of a mosaic pattern. In this case, the source region 17 is isolated from the gate region 15 as shown in FIG. 4E.

Thereafter, the silicon dioxide layer 16 corresponding to a portion 18 on which a gate electrode will be formed and to a scribe line portion 19 are selectively removed by an etching as shown in FIG. 4F. A ring 16' of semiconductor material of high imurity concentration and of the same impurity type as said substrate may be formed on said substrate surrounding the outer edge of said insulating layer 16, as shown in FIG. 3.

Then, a source electrode 20 is formed commonly to the source regions 17 forming the isolated mosaic pattern by vaporizing, for example, aluminum on the source regions 17. Electrode 20 may conveniently be in the form of a single conductive layer or plate. A gate electrode 21 is formed in the portion 18 covering the peripheral portion of the gate mosaic region 15, 18 and a drain electrode 22 is formed on the back surface of the body 10 or the free surface of the high impurity concentration semiconductor layer 13 as shown in FIG. 4G. Thus, a junction gated FET 23, such as shown in FIG. 3, is obtained.

Figure 6:
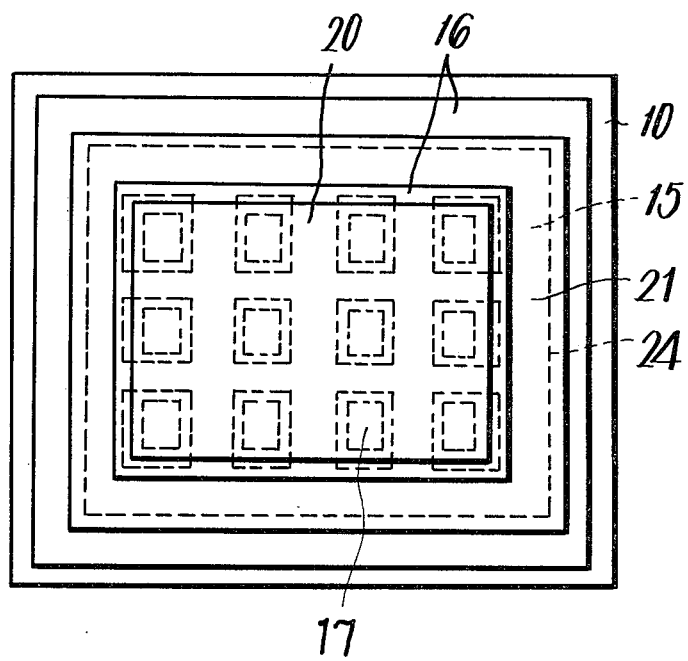
FIG. 6 is a plan view of the embodiment shown in FIG. 4G.

With the invention hereinabove described, there is formed on the gate region 15 of a mosaic pattern, an insulating layer or an oxidized layer 16 which electrically isolates the source electrode 20 from the gate region 15, so that the input capacity of the FET is reduced and it depends less upon voltage to be able to operate with low voltage. FIG. 6 is a plan view of an embodiment similar to that shown in FIG. 4G, and shows the semiconductor body 10, the buried gate region 15 of mosaic (mesh) pattern, the thick SiO₂ layer 16, a plurality of isolated source regions 17 of the mosaic pattern, the source electrode 20 covering said source region 17 and the thick SiO₂ layer 16 on the gate region 15, and the gate electrode 21 surrounding said source electrode 20.

Figure 3:
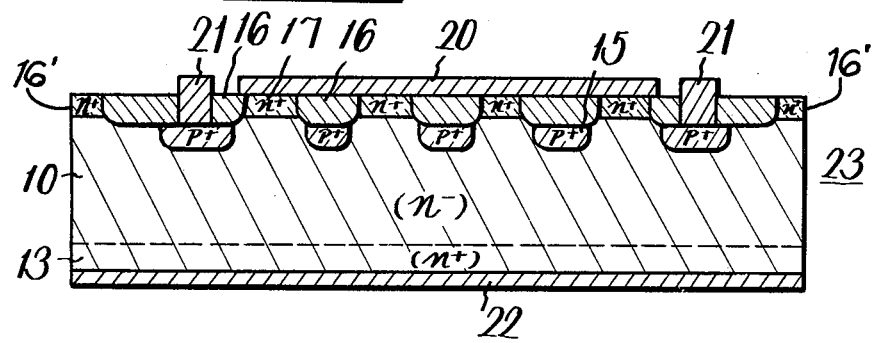
FIG. 3 is a cross-sectional view showing an embodiment of a junction gated field effect transistor according to the invention.
Figure 5A:
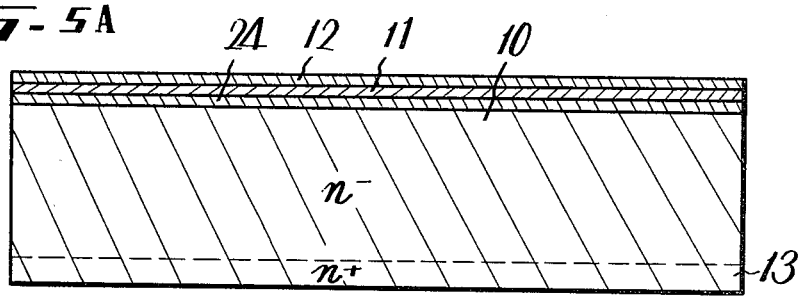
FIGS. 5A to 5D, inclusive, are cross-sectional views showing a partial process for making a junction gated field effect transistor of another type according to the invention.
Figure 5B:
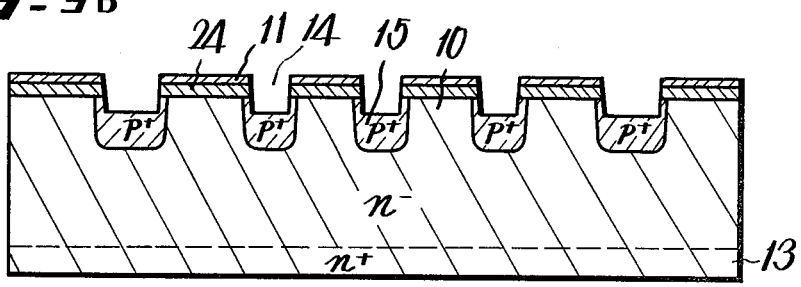
Figure 5C:
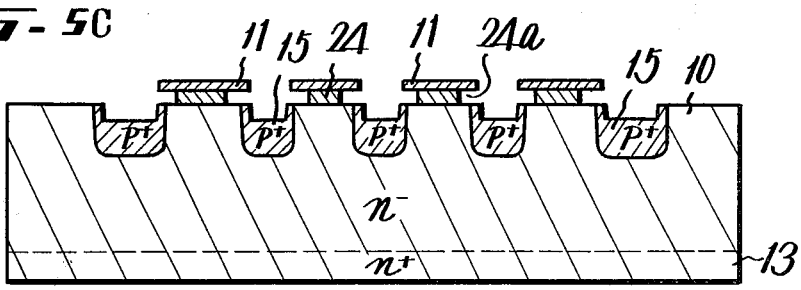
Figure 5D:
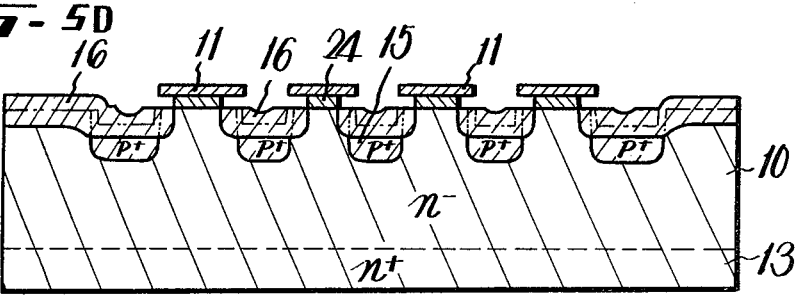

The difference between the embodiments shown in FIG. 3 and FIG. 6 is the gate electrode 21, which covers a periphery of the gate-drain junction 24. A higher breakdown voltage at the gate-drain junction is obtained by this structure shown in FIG. 6.

Figure 7:
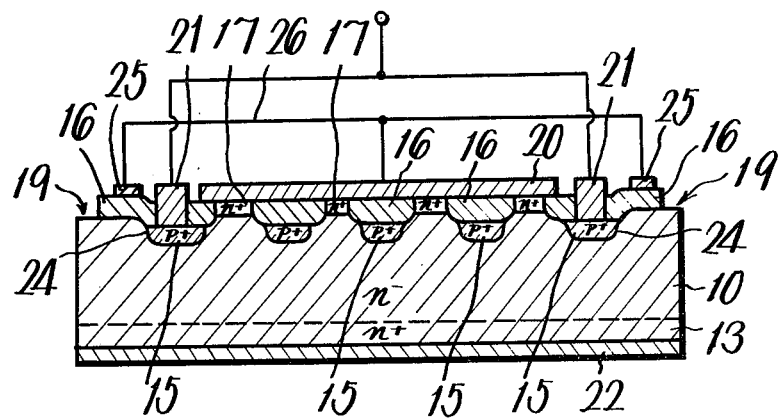
FIG. 7 is another embodiment of this invention.

Another embodiment shown in FIG. 7 also achieves the same object, which has an auxiliary electrode 25 surrounding but spaced from the gate electrode 21. The auxiliary electrode 25 covers the periphery of the edge of the junction 24, and is connected to the source electrode by a conductive lead 26. The function of this auxiliary electrode 25 is to enlarge the depletion layer formed at the back-biased junction 24 located therebeneath. This improves the breakdown voltage characteristic.

The P-type gate region 15 of high impurity concentration does not contact the N-type region 17 of high impurity concentration but contacts the N-type body 10 of low concentration, so that the withstand voltage between the source and the gate of the FET is made high enough to be desirable, the portion on the gate region 15, which is a source region in the prior art, is made as the oxidized layer 16 and the source region 17 is surrounded by the gate region or the oxidized layer 16. As a result, if the concentration and diffusion depth of the diffusion of the N-type high concentration impurity are selected suitably, the series resistance between the source and the channel surrounded by the gate of the FET can be greatly reduced.

Further, according to the invention, in the case of manufacturing the FET, no epitaxial growth process in the source region is used, so that the manufacturing process becomes simple and the FET thus manufactured is high in reliability due to the fact that the gate region 15 is of a planar type and the gate electrode 21 can be easily led out.

Further, in the invention, especially as shown in FIGS. 5A to 5D and FIGS. 4E to 4G, the photoresist process which requires very precise control is used only once for forming the recess portions which are used for making the gate regions and the other processes require no such precise control. Hence, the FET can be manufactured easily.

In the above embodiment, if another insulating layer is required, metal, such as molybdenum or the like, may be employed instead of the silicon nitride ($Si_3N_4$) layer. This layer may serve as a stoper for oxidization and if selective etching is possible, it may be practical to use.

Further, the above embodiment employs an N-tye semiconductor body of low impurity concentration as the drain region 10, but it is also possible to use an intrinsic semiconductor body as the drain region. It is also possible that another type of semiconductor body consisting of a high impurity concentration semiconductor body and a low impurity concentration drain region formed on the former may be used and the same processes are carried out for the semiconductor body.

In the above embodiments, the source and drain are shown as an N-type region and the gate as a P-type region, but it is also possible that the source and drain be made as P-type regions and the gate be made as an N-type region.

It will be apparent to those skilled in the art that many modifications and variations may be effected without departing from the spirit and scope of the novel concepts of the present invention.

What is claimed is:

1. A junction gated field effect transistor having a semiconductor substrate having formed on one major surface thereof;
    a drain region of low impurity concentration of one impurity type in said semiconductor substrate;
    a mosaic shaped gate region in said semiconductor substrate having regions of high impurity concentration of the opposite impurity type defining a grid of bars formed on the drain region;
    the portion of said semiconductor substrate lying between the bars of said grid providing channels, the length of said channels being relatively short compared to their widths;
    a corresponding mosaic grid of bars of insulating material forming a layer overlying said mosaic shaped gate region and aligned therewith, the areas between the bars of said insulating layer mosaic being smaller than areas between the bars of said grid forming said gate region;
    a gate electrode connected to said mosaic shaped gate region;
    a plurality of semiconductor source regions of high impurity concentration of said one impurity type formed on the substrate in the areas between the bars of said grid forming the insulating layer; and
    a conductive plate source electrode overlying said insulating layer and in contact with said source regions.

2. A junction gated field effect transistor according to claim 1, in which there is an auxiliary electrode on the outer periphery of said insulating layer surrounding but spaced from said gate electrode and electrically connected to said source electrode, said auxiliary electrode being located above the terminating surface end of the junction between the outer located gate regions and said substrate, said auxiliary electrode serving to enlarge the depletion layer formed at said junction, thereby improving the breakdown voltage characteristic.

3. A junction gated field effect transistor according to claim 1, in which a high impurity concentration region of the first impurity type is formed in said substrate adjacent the opposite major face of said substrate.

4. A junction gated field effect transistor according to claim 1, in which a source electrode overlies said insulating layer in contact therewith and in contact with said individual source areas.

5. A junction gated field effect transistor according to claim 1, in which there is provided on said substrate a ring of semiconductor material of high impurity concentration of the same type as said substrate surrounding the outer edge of said insulating layer.

6. A junction gated field effect transistor according to claim 1, in which said gate electrode covers the peripheral portion of the gate mosaic.

7. A junction gated field effect transistor according to claim 1, in which said mosaic shaped insulating layer is an oxidized semiconductor material.

8. A junction gated field effect transistor according to claim 1, in which the mosaic shaped insulating layer is formed of an oxide of silicon.

9. A junction gated field effect transistor having a semiconductor substrate comprising:
    a drain region of low impurity concentration of one conductivity type;
    a mosaic shaped semiconductor gate region of high impurity concentration of the opposite conductivity type formed on the drain region, the mosaic shape of said gate region forming a plurality of windows filled with part of the semiconductor material of said drain region;
    a corresponding mosaic shaped insulating layer overlying said mosaic shaped gate region and having a plurality of windows smaller than the windows of said gate region and of the same configuration, the windows of said insulating layer being aligned with the windows of said gate region;
    a gate electrode connected to said mosaic shaped gate region;
    a plurality of source regions of semiconductor material of high impurity concentration and of the same conductivity type as said drain region filling the windows of said insulating layer and isolated from said gate region; and
    a conductive plate source electrode overlying said insulating layer and in contact with said source regions.

10. A junction gated field effect transistor having a semiconductor substrate comprising:
    a drain region of low impurity concentration of one conductivity type;
    a mosaic shaped semiconductor gate region of high impurity concentration of the opposite conductivity type defining a PN junction with said drain region;
    a corresponding mosaic shaped insulating material forming an insulating layer overlying said mosaic shaped gate region and aligned therewith;
    a plurality of source regions heavily doped of said one conductivity type formed on said substrate in the areas between the portions of said insulating layer which form said insulating mosaic, the bottom of said heavily doped regions being spaced upwardly from the plane of the upper end of said mosaic shaped gate region between said portions of said insulating layer, and the upper surface of said source regions lying in the same pplane as the upper surface of said insulating layer;

a gate electrode connected to said mosaic shaped gate region; and a conductive plate source electrode in contact with said insulating layer and with said source regions.

11. A junction gated field effect transistor according to claim 10, in which areas of said source regions are smaller than areas of their associated channels at the portion where said gate terminates at said insulating layer.

* * * * *